(12) United States Patent
Takai

(10) Patent No.: US 9,280,044 B2
(45) Date of Patent: Mar. 8, 2016

(54) LIGHT-REFLECTIVE PHOTOMASK AND MASK BLANK FOR EUV EXPOSURE, AND MANUFACTURING METHOD OF SEMICONDUCTOR DEVICE

(71) Applicant: KABUSHIKI KAISHA TOSHIBA, Tokyo (JP)

(72) Inventor: Kosuke Takai, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 246 days.

(21) Appl. No.: 14/021,726

(22) Filed: Sep. 9, 2013

(65) Prior Publication Data

US 2014/0242499 A1   Aug. 28, 2014

(30) Foreign Application Priority Data

Feb. 28, 2013   (JP) ................. 2013-039952

(51) Int. Cl.
*G03F 1/24* (2012.01)
*G03F 1/22* (2012.01)

(52) U.S. Cl.
CPC ....................... *G03F 1/22* (2013.01)

(58) Field of Classification Search
CPC .................... G03F 1/22; G03F 1/24
USPC ........................................... 430/5
See application file for complete search history.

(56) References Cited

U.S. PATENT DOCUMENTS

| 2009/0220869 A1 | 9/2009 | Takai | |
| 2011/0027703 A1* | 2/2011 | Shoki | .............. 430/5 |
| 2011/0059391 A1 | 3/2011 | Shoki | |
| 2011/0117479 A1 | 5/2011 | Suga et al. | |
| 2013/0196255 A1* | 8/2013 | Hayashi | .............. 430/5 |

FOREIGN PATENT DOCUMENTS

| JP | 2004-319909 | 11/2004 |
| JP | 4602430 | 10/2010 |
| JP | 2012-204708 | 10/2012 |

OTHER PUBLICATIONS

Tsutomu Shoke; "Reflective Mask, Reflective Mask Blank and Method for Manufacturing Reflective Mask", English-Language Translation of the Abstract for WO2009-136564, (Nov. 12, 2009).
Kosuke Takai; "Reflection-Type Mask and Method of Making the Same", English-Language Translation of the Abstract for JP2009-212220, (Sep. 17, 2009).

(Continued)

*Primary Examiner* — Stephen Rosasco
(74) *Attorney, Agent, or Firm* — Finnegan, Henderson, Farabow, Garrett & Dunner, LLP

(57) ABSTRACT

According to one embodiment, a light-reflective photomask including a circuit pattern area, and an outside area positioned outside the circuit pattern area includes a substrate, a low-reflectivity layer provided in both the circuit pattern area, and the outside area, formed on the substrate, including at least a conductive layer, and comprising a first reflectivity for deep ultraviolet light, a multilayer reflection layer provided in the circuit pattern area, and formed on the low-reflectivity layer, and a light-absorber provided in the circuit pattern area, formed on the multilayer reflection layer, including a circuit pattern, and comprising a second reflectivity for deep ultraviolet light. The first reflectivity is lower than or equal to the second reflectivity.

17 Claims, 4 Drawing Sheets

(56) References Cited

OTHER PUBLICATIONS

Osamu Suga et al.; "Reflective Exposure Mask, Method of Manufacturing the Same, and Method of Manufacturing Semiconductor Device", English-Language Translation of the Abstract for JP2011-108942, (Jun. 2, 2011).

First Office Action issued by the Japanese Patent Office on dated Jun. 2, 2015, in counterpart Japanese Patent Application No. 2013-039952.

* cited by examiner

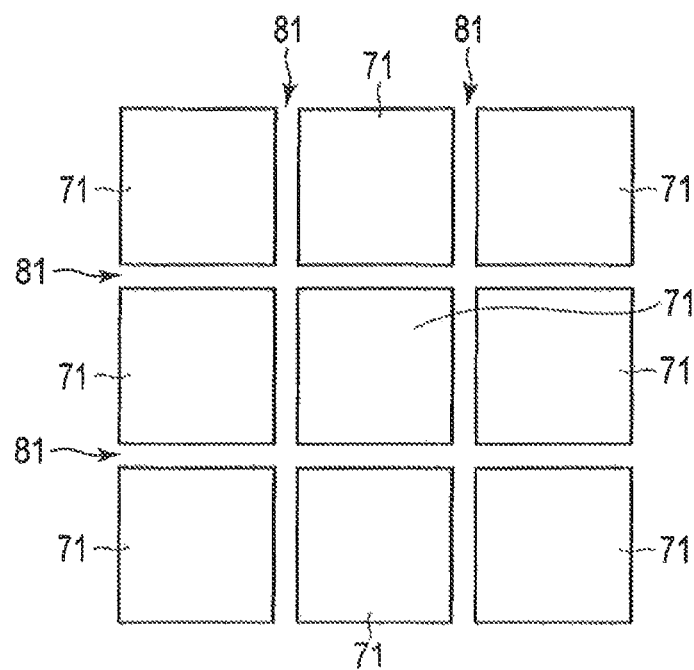
F I G. 3
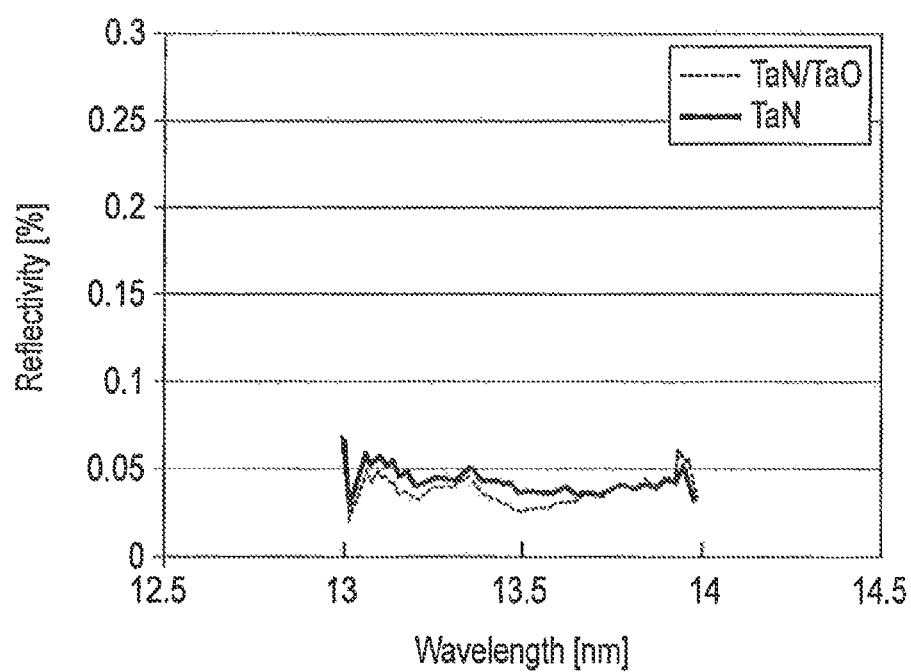
F I G. 4

LIGHT-REFLECTIVE PHOTOMASK AND MASK BLANK FOR EUV EXPOSURE, AND MANUFACTURING METHOD OF SEMICONDUCTOR DEVICE

CROSS-REFERENCE TO RELATED APPLICATIONS

This application is based upon and claims the benefit of priority from Japanese Patent Application No. 2013-039952, filed Feb. 28, 2013, the entire contents of which are incorporated herein by reference.

FIELD

Embodiments described herein relate generally to a light-reflective photomask and the like for EUV exposure.

BACKGROUND

A tight-reflective photomask utilizing extreme ultraviolet (EUV) light having a wavelength of about 13.5 nm is proposed as a lithographic technique contrived to deal with miniaturization of semiconductor devices. A light-reflective photomask for EUV exposure normally includes a multilayer reflection layer formed on a glass substrate, and light-absorber formed on the multilayer reflection layer.

In the above-mentioned light-reflective photomask, a phenomenon called a shadowing effect becomes a problem. That is, in lithography using a light-reflective photomask, exposure light (EUV light) is made incident on the photomask from a direction deviated from the vertical direction. For this reason, a shadow is created by a convex part of a circuit pattern formed on the light-absorber. Such a phenomenon is the shadowing effect. This shadowing effect can be prevented from occurring by reducing the thickness of the light-absorber. However, when the thickness of the light-absorber is reduced, the light-absorbing characteristic of the light-absorber is lowered, and the reflectivity of the light-absorber is increased. As a result, a problem that reflected light from the light-absorber affects the adjacent area to thereby adversely affect lithography is caused.

Regarding a solution of such a problem, a way of securing the low reflectivity by removing the light-absorber and multilayer reflection layer of the area outside the circuit pattern area is conceivable.

BRIEF DESCRIPTION OF THE DRAWINGS

FIG. 3 is a plan view schematically showing each of areas on a semiconductor wafer obtained when pattern transfer is carried out by using the photomask according to the embodiment.

FIG. 4 is a view showing the reflectivity for BUY light in a light shielding area with respect to each of the photomask of the embodiment and photomask of a comparative example.

DETAILED DESCRIPTION

In general, according to one embodiment, a light-reflective photomask for EUV exposure including a circuit pattern area, and an outside area positioned outside the circuit pattern area comprises: a substrate; a low-reflectivity layer provided in both the circuit pattern area, and the outside area, formed on the substrate, including at least a conductive layer, and comprising a first reflectivity for deep ultraviolet light; a multilayer reflection layer provided in the circuit pattern area, and formed on the low-reflectivity layer; and a light-absorber provided in the circuit pattern area, formed on the multilayer reflection layer, including a circuit pattern, and comprising a second reflectivity for deep ultraviolet light, wherein the first; reflectivity is lower than or equal to the second reflectivity.

Hereinafter, an embodiment will be described with reference to the drawings.

Figure 1:
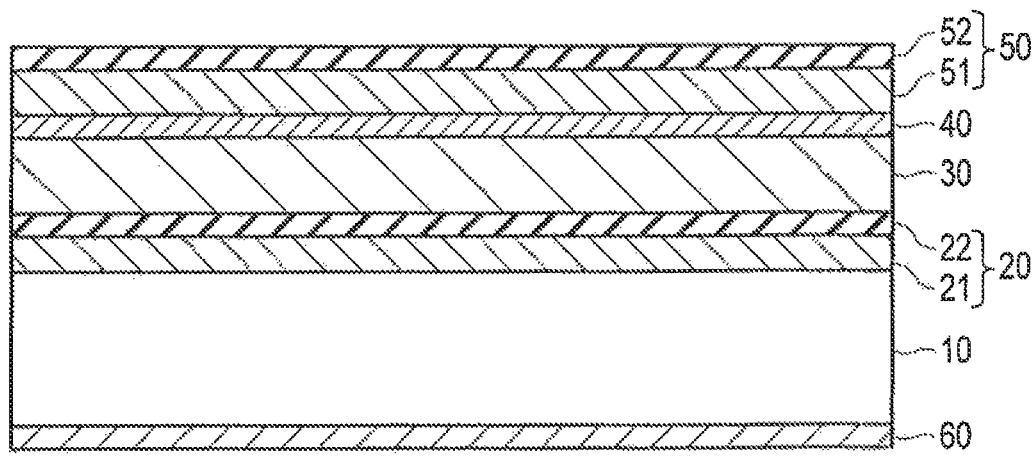
FIG. 1 is a cross-sectional view schematically showing the configuration of a mask blank according to an embodiment.

FIG. 1 is a cross-sectional view schematically showing the configuration of a mask blank according to the embodiment. This mask blank is used for a light reflective photomask for EUV exposure.

As a substrate 10 of the mask blank, a glass substrate a thermal expansion coefficient of which is extremely small is used.

On the substrate 10, a low-reflectivity layer 20 is formed. This low-reflectivity layer 20 has a low reflectivity with respect to extreme ultraviolet (EUV) light, and deep ultraviolet (DUV) light. Further, the low-reflectivity layer 20 is formed of a laminated film including a conductive layer. More specifically, a conductive layer is formed on the substrate 10 as a lower layer film 21, and oxide film is formed on the lower layer film 21 as an upper layer film 22. For example, a tantalum nitride film (TaN film) is used as the lower layer film 21, and tantalum oxide film (TaO film) is used as the upper layer film 22.

A multilayer reflection layer 30 is formed on the low-reflectivity layer 20. This multilayer reflection layer 30 is formed by alternately laminating molybdenum (Mo) and silicon (Si), and reflects EUV light used as exposure light. Each of the numbers of layers of molybdenum and silicon is about forty, and silicon is formed in the uppermost layer. This multilayer reflection layer 30 is formed by, for example, sputtering.

A capping layer 40 is formed on the multilayer reflection layer 30. As the capping layer 40, for example, a ruthenium film (Ru film) is used.

A light-absorber 50 is formed on the capping layer 40. As the light-absorber 50, a laminated film constituted of a tantalum nitride film (TaN film) 51, and tantalum oxide film (TaO film) 52 formed on the TaN film 51 is used. The TaN film Si functions mainly as an absorbing layer for EUV light. The TaO film 52 functions mainly as an antireflection layer for inspection light (light of a wavelength of, for example, about 250 nm). The light-absorber 50 has a comparatively small thickness in order to prevent the shadowing effect from occurring. Accordingly, the light-absorber 50 reflects EUV light to a certain extent. Further, the mask blank of this embodiment is applied to a light-reflective photomask provided with a phase shifting function. For this purpose, the thickness of the light-absorber 50 is adjusted in such a manner that a phase difference of 180° is created between a phase of the exposure light (EUV light) reflected from the multilayer reflection layer 30, and phase of the exposure light (EUV light) reflected from the light-absorber 50. Further, the light-reflective photomask is used as a phase shifting mask, and hence the light-absorber 50 reflects, for example, about 1 to 10% of EUV light.

The reflectivity of the low-reflectivity layer 20 for EUV light incident thereon is lower than that of the light-absorber 50 formed on the multilayer reflection layer 30. The low-reflectivity layer 20 has a first reflectivity for deep ultraviolet light, further, the light-absorber 50 has a second reflectivity for deep ultraviolet light, and the first reflectivity is lower than or equal to the second reflectivity. That is, the light quantity of the reflected light of deep ultraviolet light from the surface of the low-reflectivity layer 20 per unit area is smaller than or equal to the light quantity of the reflected light of deep ultraviolet light from the surface of the light-absorber 50 per unit area. It should be noted that the wavelength range of deep ultraviolet light is generally about 130 nm to 320 nm.

On the backside of the substrate 10, for example, a CrN film is formed as a conducting film 60 to be used as an electrostatic chuck.

Figure 2:
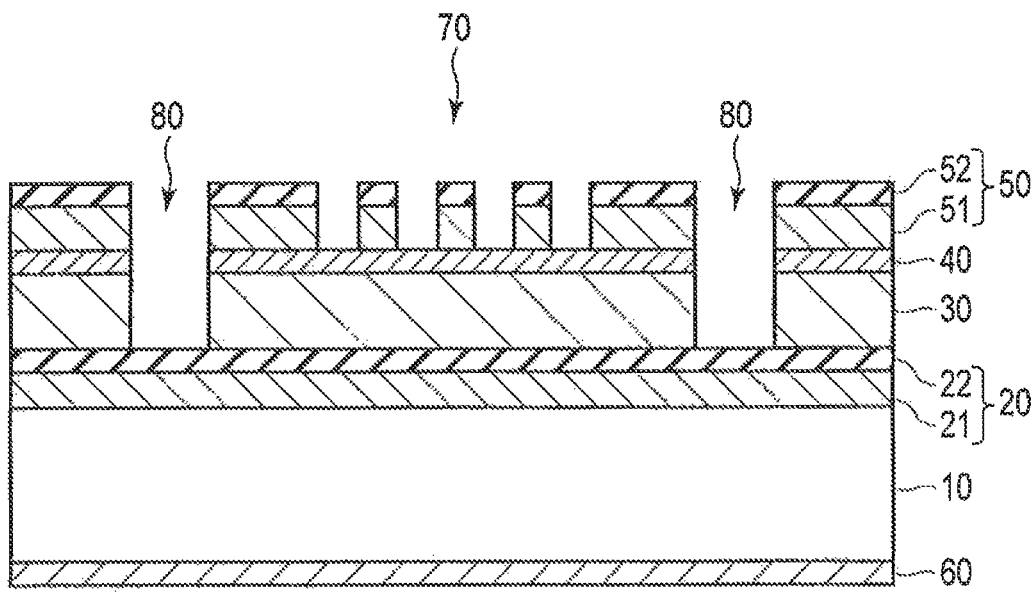
FIG. 2 is a cross-sectional view schematically showing the configuration of a photomask according to the embodiment.

FIG. 2 is a cross-sectional view schematically showing the configuration of a light-reflective photomask for EUV exposure according to the embodiment. The photomask shown in FIG. 2 is manufactured from the mask blank shown in FIG. 1.

The photomask shown in FIG. 2 includes a circuit pattern area 70, and outside area 80 positioned outside the circuit pattern area 70. More specifically, the outside area 80 surrounds the circuit pattern area 70. It should be noted that the outside area 80 is normally called a light shielding area or a light shielding frame area. Accordingly, in the following description, the outside area 80 is called a light shielding area or a light shielding frame area in some cases.

Hereinafter, the configuration of the light reflective photomask shown in FIG. 2 will be describe.

On the substrate (glass substrate) 10, the low-reflectivity layer 20 is formed. This low-reflectivity layer 20 is formed in both the circuit pattern area 70 and light shielding area 80.

The multilayer reflection layer 30 is formed on the low-reflectivity layer 20, capping layer 40 is formed on the multilayer reflection layer 30, and light-absorber 50 is formed on the capping layer 40. The multilayer reflection layer 30, capping layer 40, and light-absorber 50 are formed in the circuit pattern area 70, and are not formed in the light shielding area 80. Further, in the light-absorber 50, a circuit pattern is formed.

On the backside of the substrate 10, the conducting film 60 to be used an electrostatic chuck is formed.

Hereinafter, a manufacturing method of the light-reflective photomask shown in FIG. 2 will be described.

First, the mask blank shown in FIG. 1 is prepared, and a resist layer is formed on the principal surface (i.e., on the light-absorber 50) of the mask blank. Subsequently, a circuit pattern is written on the resist layer by using an electron beam. Subsequently, development of the resist layer is carried out to thereby form a resist pattern. Furthermore, the light-absorber 50 is etched by plasma etching by using the resist pattern as a mask. Thereafter, a circuit pattern is obtained by carrying out a defect inspection process, and defect correction process.

After the circuit pattern is formed, a resist pattern including an opening pattern is formed in the area in which the light shielding area 80 is to be formed. The light-absorber 50, capping layer 40, and multilayer reflection layer 30 are etched by using this resist pattern as a mask. As a result, in the light shielding area 80, the light-absorber 50, capping layer 40, and multilayer reflection layer 30 are removed, and the low-reflectivity layer 20 is exposed.

In the manner described above, the light-reflective photomask shown in FIG. 2 is obtained.

FIG. 3 is a plan view schematically showing each of areas on a semiconductor wafer obtained when pattern transfer is carried out by using the photomask of FIG. 2. In FIG. 3, a state on the semiconductor wafer where nine shots of pattern transfer of the photomask shown in FIG. 2 are carried out is shown. Each of areas 71 and 81 in FIG. 3 corresponds to each of the areas 70 and 80 in FIG. 2, respectively.

As described above, in the photomask and mask blank according to this embodiment, the reflectivity of the low-reflectivity layer 20 for deep ultraviolet light is lower than or equal to the reflectivity of the light-absorber 50 for deep ultraviolet light. As described above, in this embodiment, the reflectivity of the low-reflectivity layer 20 for deep ultraviolet light is low, and hence the reflectivity for deep ultraviolet light becomes low in the light shielding area 80 in which the low-reflectivity layer 20 is exposed. As a result, it is possible to prevent deep ultraviolet light reflected from the light shielding area 80 from adversely affecting the adjacent circuit pattern area 71 on the semiconductor wafer. Hereinafter, a description will be added to this point.

When EUV exposure is to be carried out, deep ultraviolet light is also generated from the EUV light source in addition to the EUV light. Further, when the circuit pattern area 70 is subjected to exposure, the light shielding area 80 adjacent thereto is also irradiated with the exposure light. Heretofore, although the EUV light reflectivity in the light shielding area 80 might have been taken into consideration, the reflectivity for deep ultraviolet light has not been taken into consideration. Accordingly, there has been the possibility of deep ultraviolet light elected from the light shielding area 80 adversely affecting the circuit pattern area 71 adjacent to the area 80 on the semiconductor wafer to thereby make it impossible to carry out appropriate exposure.

In this embodiment, the reflectivity of the low reflectivity layer 20 is low not only for EUV light but also so for deep ultraviolet light. Therefore, it is possible to prevent the reflected light from the light shielding area 80 from adversely affecting the circuit pattern area 71 adjacent to the area 80 not only for EUV light but also for deep ultraviolet light. Consequently, according to this embodiment, it is possible to carry out excellent lithography by using a light-reflective photomask including an appropriate low-reflectivity layer.

Further, in this embodiment, as in the conventional case, the low-reflectivity layer 20 includes at least a conductive layer. More specifically, the low-reflectivity layer 20 is formed of a laminated film including a conductive layer. Accordingly, it is possible to effectively prevent charge-up or the like from occurring at the time of photomask inspection.

Further, in this embodiment, as in the conventional case, it is possible to make the thickness of the light-absorber small, and hence it is possible to prevent the shadowing effect from occurring. Further, the thickness of the light-absorber can be made small, and hence it is possible to obtain an excellent phase shifting mask by creating a phase difference of 180° between the phase of the exposure light (EUV light) reflected from the multilayer reflection layer 30, and phase of the exposure light (EUV light) reflected from the light-absorber 50.

Figure 5:
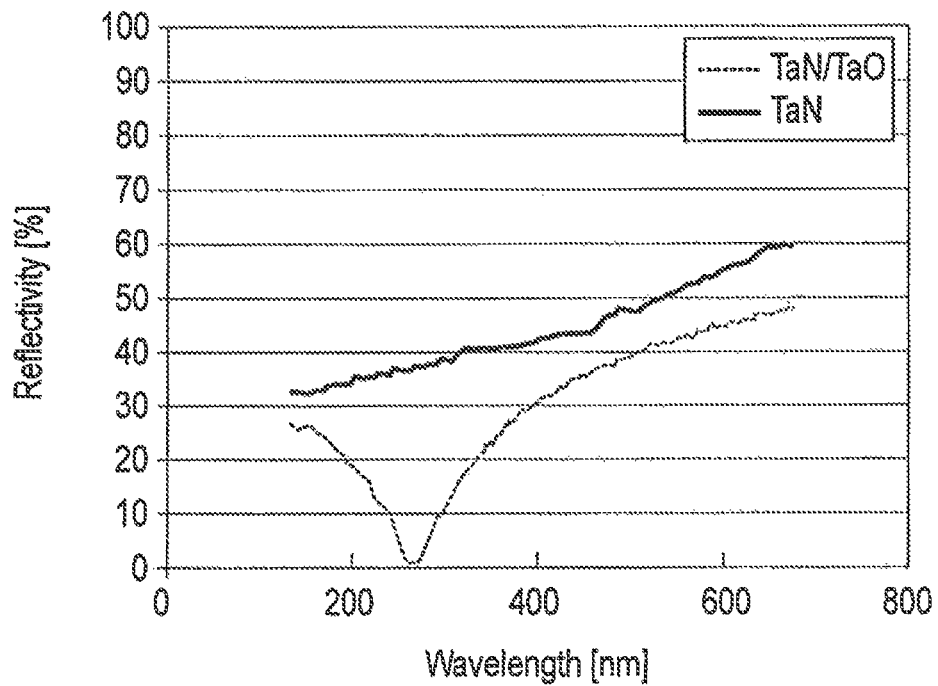
FIG. 5 is a view showing the reflectivity for deep ultraviolet light in a light shielding area with respect to each of the photomask of the embodiment and photomask of the comparative example.

FIG. 4 is a view showing the reflectivity for EUV light in a light shielding area with respect to each of the photomask of the embodiment and photomask of a comparative example. FIG. 5 is a view showing the reflectivity for deep ultraviolet light in a light shielding area with respect to each of the photomask of the embodiment and photomask of the comparative example. In the photomask of this embodiment, the light shielding area is constituted of a laminated structure of a TaN film and TaO film formed on the TaN film, and in the photomask of the comparative example, the light shielding area is constituted of a single layer structure of a TaN film.

As shown in FIG. 4, the reflectivity of this embodiment for EUV light is substantially equal to the reflectivity of the comparative example for EUV light, and both of them are low. Conversely, as shown in FIG. 5, the reflectivity of this embodiment for deep ultraviolet light is greatly lower than the reflectivity of the comparative example for deep ultraviolet light.

Figure 6:
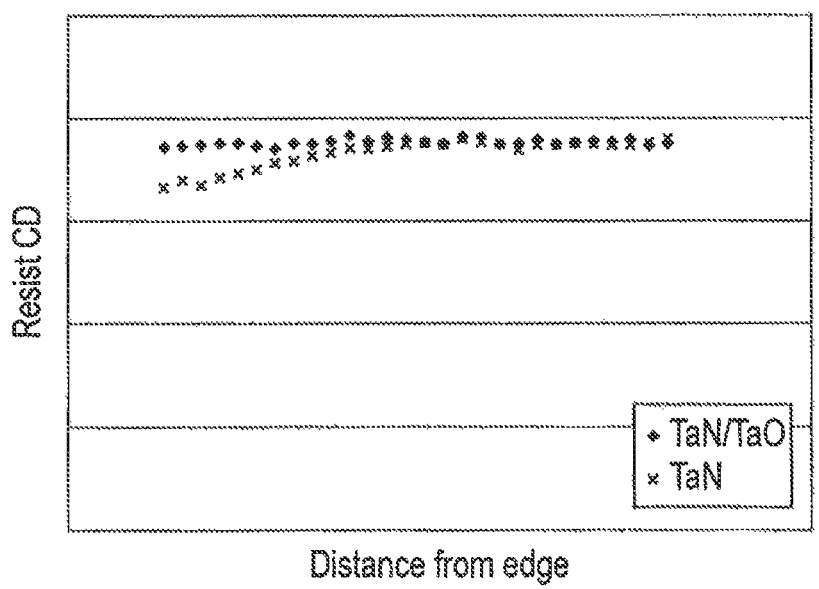
FIG. 6 is a view showing the relationship between a distance from an edge of a circuit pattern area, and resist C with respect to each of the photomask of the embodiment and photomask of the comparative example.

FIG. 6 is a view showing the relationship between a distance from an edge (boundary between the circuit pattern area 71 and area 81) of the circuit pattern area 71 of FIG. 3, and resist CD with respect to each of the photomask of this embodiment and photomask of the comparative example. In the photomask of this embodiment, the light shielding area is constituted of a laminated structure of a TaN film and TaO film formed on the TaN film, and in the photomask of the comparative example, the light shielding area is constituted of a single layer structure of a TaN film.

As can be seen from FIG. 6, in the comparative example, the resist CD becomes worse near the edge. Conversely, in this embodiment, deterioration in the resist CD is hardly found. This can be considered to be attributable to the fact that in the comparative example, the circuit pattern area 71 adjacent to the light shielding area 80 on the semiconductor wafer is adversely affected by deep ultraviolet light reflected from the area 80, whereas in this embodiment, such a problem is prevented from occurring. Accordingly, it is possible to carry out excellent lithography, and improve the manufacturing yield by using the mask blank, and photomask of this embodiment.

It should be noted that in the above-mentioned embodiment, although a film including tantalum (Ta) is used as the low-reflectivity layer 20, the low-reflectivity layer 20 may be formed of a film including at least one or more elements selected from tantalum (Ta), silicon (Si), chromium (Cr), molybdenum (Mo), and ruthenium (Ru). For example, it is possible to use a conductive layer constituted of the above-mentioned element or a conductive layer constituted of a film of a nitride of the above-mentioned element as the lower layer film 21 of the low-reflectivity layer 20, and use a film of an oxide of the above-mentioned element as the upper layer film 22 of the low-reflectivity layer 20.

Figure 7:
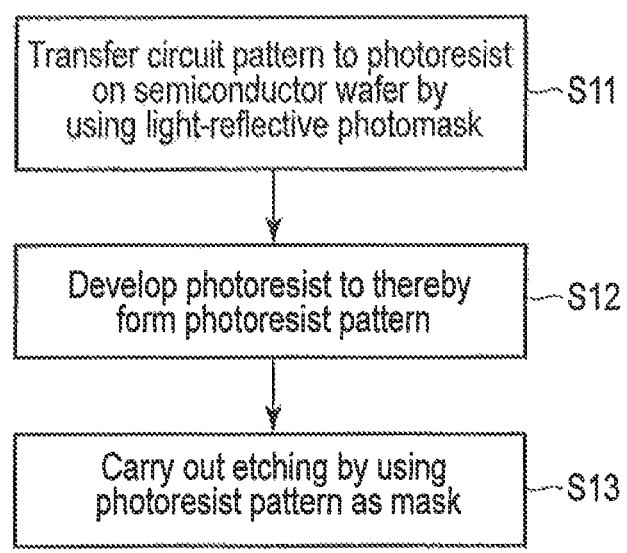
FIG. 7 is a flowchart showing a manufacturing method of a semiconductor device according to the embodiment.

Further, the mask blank and photomask shown in the above-mentioned embodiment can be applied to a manufacturing method of a semiconductor device. FIG. 7 is a flowchart showing a manufacturing method of a semiconductor device.

First, the light-reflective photomask shown in the above-mentioned embodiment is prepared, and a circuit pattern is transferred to the photoresist on the semiconductor wafer (semiconductor substrate) by using the light-reflective photomask (S11). Next, the photoresist is developed to thereby form a photoresist pattern (S12) Next, etching is carried out by using the photoresist pattern as a mask to thereby form a circuit pattern on the semiconductor wafer (S13).

As described above, it is possible to form an appropriate circuit pattern on the semiconductor substrate by using the mask blank and photomask of this embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-reflective photomask for EUV exposure including a circuit pattern area, and an outside area positioned outside the circuit pattern area, comprising:
    a substrate;
    a low-reflectivity layer provided in both the circuit pattern area, and the outside area, formed on the substrate, including at least a conductive layer, and comprising a first reflectivity for deep ultraviolet light;
    a multilayer reflection layer provided in the circuit pattern area, and formed on the low-reflectivity layer; and
    a light-absorber provided in the circuit pattern area, formed on the multilayer reflection layer, including a circuit pattern, and comprising a second reflectivity for deep ultraviolet light,
    wherein the first reflectivity is lower than or equal to the second reflectivity.
2. The light-reflective photomask of claim 1, wherein the low-reflectivity layer is formed of a laminated film including the conductive layer.
3. The light-reflective photomask of claim 2, wherein the laminated film is formed of the conductive layer and an oxide film provided on the conductive layer.
4. The light-reflective photomask of claim 3, wherein the oxide film includes an oxide of an element included in the conductive layer.
5. The light-reflective photomask of claim 1, wherein the low-reflectivity layer includes at least one or more elements selected from tantalum (Ta), silicon (Si), chromium (Cr), molybdenum (Mo), and ruthenium (Ru).
6. The light-reflective photomask of claim 1, wherein the outside area surrounds the circuit pattern area.
7. The light-reflective photomask of claim 1, wherein the light-reflective photomask comprises a phase shifting function.
8. A manufacturing method of a semiconductor device comprising a step of transferring a pattern formed on the light-reflective photomask of claim 1 to a photoresist on a semiconductor substrate by using EUV light.
9. The light-reflective photomask of claim 1, wherein the low-reflectivity layer in the outside area has an opening portion thereon, the opening portion exposing the low-reflectivity layer at a bottom portion thereof.
10. The light-reflective photomask of claim 1, wherein the outside area adjoins the circuit pattern area, a surface of the outside area is lower than that of the circuit pattern area, and the surface of the outside area is the low-reflectivity layer.
11. The light-reflective photomask of claim 1, wherein a surface of the outside area is the low-reflectivity layer and adjoins the multilayer reflection layer of the circuit pattern area.
12. A mask blank used for a light-reflective photomask for EUV exposure comprising:
    a substrate;
    a low-reflectivity layer formed on the substrate, including at least a conductive layer, and comprising a first reflectivity for deep ultraviolet light;
    a multilayer reflection layer formed on the low-reflectivity layer; and
    a light-absorber formed on the multilayer reflection layer, and comprising a second reflectivity for deep ultraviolet light, wherein the first reflectivity is lower than or equal to the second reflectivity.

13. The mask blank of claim 12, wherein
the low-reflectivity layer is formed of a laminated film including the conductive layer.

14. The mask blank of claim 13, wherein
the laminated film is formed of the conductive layer and an oxide film provided on the conductive layer.

15. The mask blank of claim 14, wherein
the oxide film includes an oxide of an element included in the conductive layer.

16. The mask blank of claim 12, wherein
the low-reflectivity layer includes at least one or more elements selected from tantalum (Ta), silicon (Si), chromium (Cr), molybdenum (Mo), and ruthenium (Ru).

17. The mask blank of claim 12, wherein
the mask blank is used for a light-reflective photomask comprising a phase shifting function.

* * * * *